(12) United States Patent
Liu et al.

(10) Patent No.: US 10,475,511 B1
(45) Date of Patent: Nov. 12, 2019

(54) READ OPERATION WITH DATA LATCH AND SIGNAL TERMINATION FOR 1TNR MEMORY ARRAY

(71) Applicant: Crossbar, Inc., Santa Clara, CA (US)

(72) Inventors: Lin Shih Liu, Fremont, CA (US);
Tianhong Yan, Saratoga, CA (US);
Sung Hyun Jo, Sunnyvale, CA (US);
Sang Nguyen, Union City, CA (US);
Hagop Nazarian, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 16/193,592

(22) Filed: Nov. 16, 2018

Related U.S. Application Data

(63) Continuation of application No. 15/637,990, filed on Jun. 29, 2017, now Pat. No. 10,134,469.

(60) Provisional application No. 62/357,058, filed on Jun. 30, 2016.

(51) Int. Cl.
*G11C 11/00* (2006.01)
*G11C 13/00* (2006.01)
*G11C 7/06* (2006.01)

(52) U.S. Cl.
CPC .......... *G11C 13/004* (2013.01); *G11C 11/005* (2013.01); *G11C 13/0007* (2013.01); *G11C 13/0026* (2013.01); *G11C 13/0028* (2013.01); *G11C 13/0033* (2013.01); *G11C 13/0061* (2013.01); *G11C 13/0064* (2013.01); *G11C 7/062* (2013.01); *G11C 7/065* (2013.01); *G11C 2013/0042* (2013.01); *G11C 2013/0054* (2013.01); *G11C 2013/0057* (2013.01); *G11C 2013/0073* (2013.01)

(58) Field of Classification Search
CPC . G11C 13/004; G11C 11/005; G11C 13/0007; G11C 13/0026; G11C 13/0028; G11C 13/0033; G11C 13/0061; G11C 13/0064; G11C 7/062
USPC .................................................. 365/148, 163
See application file for complete search history.

(56) References Cited

U.S. PATENT DOCUMENTS

2014/0301130 A1* 10/2014 Siau .................. G11C 13/0069
365/148

* cited by examiner

*Primary Examiner* — Huan Hoang
(74) *Attorney, Agent, or Firm* — Wegman Hessler

(57) ABSTRACT

Two-terminal memory can be formed into a memory array that contains many discrete memory cells in a physical and a logical arrangement. Where each memory cell is isolated from surrounding circuitry by a single transistor, the resulting array is referred to as a 1T1R memory array. In contrast, where a group of memory cells are isolated from surrounding circuitry by a single transistor, the result is a 1TnR memory array. Because memory cells of a group are not isolated among themselves in the 1TnR case, bit disturb effects are theoretically possible when operating on a single memory cell. Read operations are disclosed for two-terminal memory devices configured to mitigate bit disturb effects, despite a lack of isolation transistors among memory cells of an array. Disclosed operations can facilitate reduced bit disturb effects even for high density two-terminal memory cell arrays.

9 Claims, 13 Drawing Sheets

READ OPERATION WITH DATA LATCH AND SIGNAL TERMINATION FOR 1TNR MEMORY ARRAY

CROSS-REFERENCE TO RELATED APPLICATION

The present application for patent is a continuation of and claims priority to U.S. patent application Ser. No. 15/637,990 filed Jun. 29, 2017 and titled "READ OPERATION WITH DATA LATCH AND SIGNAL TERMINATION FOR 1TNR MEMORY ARRAY", which claims the benefit of U.S. Provisional Patent Application No. 62/357,058 filed Jun. 30, 2016 and titled "READ OPERATION WITH DATA LATCH AND SIGNAL TERMINATION FOR 1TNR MEMORY ARRAY", which is hereby incorporated by reference herein in its entirety and for all purposes.

TECHNICAL FIELD

This disclosure generally relates to enhanced techniques for read a state of a two-terminal memory cell, and more specifically to data latch and signal termination associated with reading the memory cell.

BACKGROUND

Resistive-switching memory represents a recent innovation within the field of integrated circuit technology. While much of resistive-switching memory technology is in the development stage, various technological concepts for resistive-switching memory have been demonstrated by the inventor(s) and are in one or more stages of verification to prove or disprove associated theories or techniques. The inventor(s) believe that resistive-switching memory technology shows compelling evidence to hold substantial advantages over competing technologies in the semiconductor electronics industry.

The inventor(s) believe that resistive-switching memory cells can be configured to have multiple states with distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell can be correlated with logical information states, facilitating digital memory operations. Accordingly, the inventor(s) believe that arrays of many such memory cells can provide many bits of digital memory storage.

The inventor(s) have been successful in inducing resistive-switching memory to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventor(s) have put forth several proposals for practical utilization of resistive-switching technology to include transistor-based memory applications. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors.

In light of the above, the inventor(s) desire to continue developing practical utilization of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

The subject disclosure provides for improved read operations for non-volatile memory devices for in a memory array. A disclosed read operation(s) can involve a read signal implemented at a start of a read cycle, and then terminated once a data value of a target memory cell is acquired. This termination of the read signal can be implemented prior to completion of the read cycle. Further, the data value can be latched in some embodiments, to hold the data value temporarily after the read signal is terminated. In one or more embodiments, a precharge voltage can be applied to the target memory cell as well as memory cells on neighboring bitlines or wordlines of the memory array to mitigate bit disturb effects on these neighboring memory cells. Likewise, termination of the read signal prior to completion of the read signal and latching the data value can facilitate completion of the read operation prior to deactivation of the target memory cell, in some embodiments.

Further embodiments disclose a method of reading a two-terminal non-volatile memory cell. The method can comprise applying a precharge voltage to a selected bitline, a selected wordline and unselected bitlines of a memory array and increasing the precharge voltage to a read voltage across the selected bitline and the selected wordline of the memory array. Additionally, the method can comprise detecting a memory state of a target two-terminal memory device connected to the selected bitline and the selected wordline and latching a data value associated with the memory state. Furthermore, the method can comprise lowering the read voltage in response to latching the data value while maintaining the precharge voltage on the unselected bitlines of the memory array.

In one or more embodiments, there is also provided a method of reading a memory array. The method can comprise applying a selector activation voltage to a selected bitline of a target two-terminal memory device and applying ground to a selected wordline associated with the target two-terminal memory device. Furthermore, the method can comprise maintaining the selector activation voltage for an activation period. Moreover, the method can comprise decreasing a voltage magnitude across the selected bitline and the selected wordline to a sensing voltage magnitude and latching a data value stored at the target two-terminal memory device. In addition, the method can comprise disconnecting the sensing voltage magnitude from the target two-terminal memory device.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure;

FIG. 13 illustrates a block diagram of an example electronic operating environment in accordance with certain embodiments of this disclosure;

DETAILED DESCRIPTION

Introduction

Figure 1:
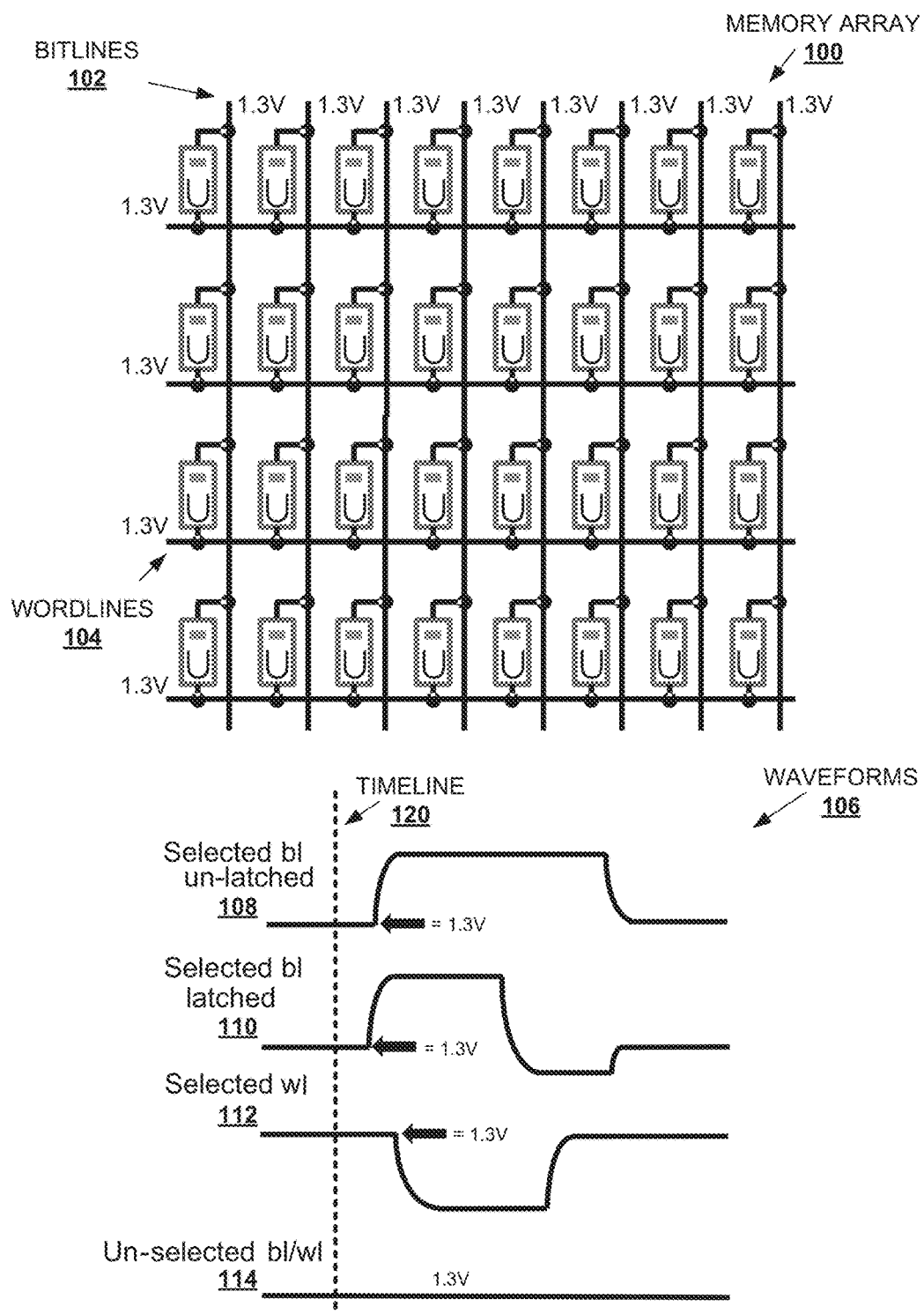
FIG. 1 illustrates a diagram of a first stage of an example read operation for an array of memory cells according to an embodiment of the present disclosure.

As the name implies, two-terminal memory has two terminals or electrodes. Herein, the terms "electrode" and "terminal" are used interchangeably. Generally, a first electrode of two-terminal memory is referred to as a "top electrode" (TE) and a second electrode of the two-terminal memory is referred to as a "bottom electrode" (BE), although it is understood that electrodes of two-terminal memory can be according to any suitable arrangement, including a horizontal arrangement in which components of a memory cell are (substantially) side-by-side rather than overlying one another. Situated between the TE and BE of a two-terminal memory cell is typically an interface layer sometimes referred to as a switching layer, a resistive switching medium (RSM) or a resistive switching layer (RSL).

Referring more generally to the disclosed embodiments, two-terminal memory cells can include a resistive technology, such as a resistive-switching two-terminal memory cell. Resistive-switching two-terminal memory cells (also referred to as resistive-switching memory cells or resistive-switching memory), as utilized herein, comprise circuit components having a pair of conductive contacts with an active region between the conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the conductive contacts. These electrical signals can be selected to have suitable characteristics, such as a voltage or current value, a voltage or current polarity, a field strength, a field polarity, or the like, or a suitable combination thereof. Examples of a resistive switching two-terminal memory device, though not exhaustive, can include a resistive random access memory (RRAM), a phase change RAM (PCRAM) and a magnetic RAM (MRAM).

Programmable arrays described in the subject disclosure can be filamentary-based devices, in various embodiments, including, e.g., a non-volatile memory device, a volatile selector device, a combination of the foregoing, or a similar device. Composition of filamentary-based devices can vary per device, with different components selected to achieve desired characteristics (e.g., volatility/non-volatility, on/off current ratio, switching time, read time, memory durability, program/erase cycle, and so on). One example of a filamentary-based device can comprise: a conductive layer, e.g., metal, metal-alloy, metal-nitride, (e.g., comprising TiN, TaN, TiW, or other suitable metal compounds), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.)), a resistive switching layer (RSL) and an active metal-containing layer capable of being ionized. Under suitable conditions, the active metal-containing layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer.

A RSL (which can also be referred to in the art as a resistive switching media (RSM)) can comprise, e.g., an undoped amorphous Si-containing layer, a semiconductor layer having intrinsic characteristics, a silicon nitride (e.g., SiN, Si3N4, SiNx, etc.), a Si sub-oxide (e.g., SiOx wherein x has a value between 0.1 and 2), a Si sub-nitride, a metal oxide, a metal nitride, a non-stoichiometric silicon compound, and so forth. Other examples of materials suitable for the RSL could include SixGeyOz (where x, y and z are respective suitable positive numbers), a silicon oxide (e.g., SiON, where N is a suitable positive number), a silicon oxynitride, an undoped amorphous Si (a-Si), amorphous SiGe (a-SiGe), TaOB (where B is a suitable positive number), HfOC (where C is a suitable positive number), TiOD (where D is a suitable number), Al2OE (where E is a suitable positive number) and so forth, a nitride (e.g. AN, SiN), or a suitable combination thereof.

In some embodiments, a RSL employed as part of a non-volatile memory device (non-volatile RSL) can include a relatively large number (e.g., compared to a volatile selector device) of material voids or defects to trap neutral metal particles (at least at low voltage) within the RSL. The large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation. In other embodiments, a RSL employed for a volatile selector device (volatile RSL) can have very few material voids or defects. Because of the few particle-trapping voids/defects, a conductive filament formed in such an RSL can be quite thin, and unstable absent a suitably high external stimulus (e.g., an electric field, voltage, current, joule heating, or a suitable combination thereof). Moreover, the particles can be selected to have high surface energy, and good diffusivity within the RSL. This leads to a conductive filament that can form rapidly in response to a suitable stimulus, but also deform quite readily, e.g., in response to the external stimulus dropping below a deformation magnitude. Note that a volatile RSL and conductive filament for the selector device can have different electrical characteristics than a conductive filament and non-volatile RSL for the non-volatile memory device. For instance, the selector device RSL can have higher material electrical resistance, and can have higher on/off current ratio, among others.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as compounds, nitrides, oxides, alloys, or combinations of the foregoing or similar materials can be employed for the active metal-containing layer in some aspects of the subject disclosure. Further, a non-stoichiometric compound, such as a non-stoichiometric metal oxide or metal nitride (e.g., AlOx, AlNx, CuOx, CuNx, AgOx, AgNx, and so forth, where x is a suitable positive number $0<x<2$, which can have differing values for differing ones of the non-stoichiometric compounds) or other suitable metal compound can be employed for the active metal-containing layer, in at least one embodiment.

In one or more embodiments, a disclosed filamentary resistive switching device can include an active metal layer comprising a metal nitride selected from the group consisting of: TiNx, TaNx, AlNx, CuNx, WNx and AgNx, where x is a positive number. In a further embodiment(s), the active metal layer can comprise a metal oxide selected from the group consisting of: TiOx, TaOx, AlOx, CuOx, WOx and AgOx. In yet another embodiment(s), the active metal layer can comprise a metal oxi-nitride selected from the group consisting of: TiOaNb, AlOaNb, CuOaNb, WOaNb and AgOaNb, where a and b are positive numbers. The disclosed filamentary resistive switching device can further comprise a switching layer comprising a switching material selected from the group consisting of: SiOy, AlNy, TiOy, TaOy, AlOy, CuOy, TiNx, TiNy, TaNx, TaNy, SiOx, SiNy, AlNx, CuNx, CuNy, AgNx, AgNy, TiOx, TaOx, AlOx, CuOx, AgOx, and AgOy, where x and y are positive numbers, and y is larger than x. Various combinations of the above are envisioned and contemplated within the scope of embodiments of the present invention.

In one example, a disclosed filamentary resistive switching device comprises a particle donor layer (e.g., the active metal-containing layer) comprising a metal compound and a resistive switching layer. In one alternative embodiment of this example, the particle donor layer comprises a metal nitride: MNx, e.g., AgNx, TiNx, AlNx, etc., and the resistive switching layer comprises a metal nitride: MNy, e.g., AgOy, TiOy, AlOy, and so forth, where y and x are positive numbers, and in some cases y is larger than x. In an alternative embodiment of this example, the particle donor layer comprises a metal oxide: MOx, e.g., AgOx, TiOx, AlOx, and so on, and the resistive switching layer comprises a metal oxide: MOy, e.g., AgOy, TiOy, AlOy, or the like, where y and x are positive numbers, and in some cases y is larger than x. In yet another alternative, the metal compound of the particle donor layer is a MNx (e.g., AgNx, TiNx, AlNx, etc.), and the resistive switching layer is selected from a group consisting of MOy (e.g., AgOy, TiOy, AlOy, etc.) and SiOy, where x and y are typically non-stoichiometric values, or vice versa in a still further embodiment.

As utilized herein, variables x, a, b, and so forth representative of values or ratios of one element with respect to another (or others) in a compound can have different values suitable for respective compounds, and are not intended to denote a same or similar value or ratio among the compounds. Some details pertaining to embodiments of the subject disclosure similar to the foregoing example(s) can be found in the following U.S. patent applications that are licensed to the assignee of the present application for patent: application Ser. No. 11/875,541 filed Oct. 19, 2007 and application Ser. No. 12/575,921 filed Oct. 8, 2009, and the following U.S. patent application assigned to the assignee of the present application for patent: application Ser. No. 14/588,185 filed Dec. 31, 2014; each of the foregoing patent applications are hereby incorporated by reference herein in their respective entireties and for all purposes.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

In various embodiments, filamentary-based resistance switching devices can operate in a bipolar fashion, behaving differently in response to different polarity (or direction, energy flow, energy source orientation, etc.) external stimuli. For the volatile filamentary-based selector device, as an illustrative example, in response to a first polarity stimulus exceeding a first threshold voltage (or set of voltages), the filamentary selector device can change to a second resistance state from a first resistance state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), having the same or similar magnitude of threshold stimulus (though of opposite polarity or direction), or the like. In other embodiments, the third state can be distinct from the second state, either in terms of the measurable characteristic (e.g., different electrically conductivity value in response to the reverse polarity as compared to the forward polarity) or in terms of threshold stimulus associated with transitioning out of the first state (e.g., a different magnitude of positive voltage required to transition to the second state, compared to a magnitude of negative voltage required to transition to the third state).

For bipolar operation of a non-volatile filamentary-based memory cell, a conductive path or a filament forms through a non-volatile RSL in response to a suitable program voltage applied across the memory cell. In particular, upon application of a programming voltage, metallic ions are generated from the active metal-containing layer and migrate into the non-volatile RSL layer. The metallic ions can occupy voids or defect sites within the non-volatile RSL layer. In some embodiments, upon removal of the bias voltage, the metallic ions become neutral metal particles and remain trapped in voids or defects of the non-volatile RSL layer. When sufficient particles become trapped, a filament is formed and the memory cell switches from a relatively high resistive state, to a relatively low resistive state. More specifically, the trapped metal particles provide the conductive path or filament through the non-volatile RSL layer, and the resistance is typically determined by a tunneling resistance through the non-volatile RSL layer. In some resistive-switching devices, an erase process can be implemented to deform the conductive filament, at least in part, causing the memory cell to return to the high resistive state from the low resistive state. More specifically, upon application of an erase bias voltage, the metallic particles trapped in voids or defects of the non-volatile RSL become mobile ions and migrate back towards the active metal layer. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in such memory cells.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

As mentioned above, applying a program voltage (also referred to as a "program pulse") to one of the electrodes of the two-terminal memory can cause a conductive filament to form in an interface layer (e.g., a RSL). By convention and as generally described herein, the TE receives the program pulse and the BE is grounded (or held at lower voltage or opposite polarity compared to the program pulse), but such is not intended to be limiting for all embodiments. Conversely, applying an "erase pulse" to one of the electrodes (generally a pulse of opposite polarity as the program pulse or to the opposite electrode as the program pulse) can break continuity of the filament, e.g., by driving the metal particles or other material that forms the filament back toward the active metal source. Properties of this conductive filament as well as its presence or absence affect the electrical characteristics of the two-terminal memory cell such as, for example, lowering the resistance and/or increasing conductance across the two terminals when the conductive filament is present as opposed to when not present.

Following program or erase pulses, a read pulse can be asserted. This read pulse is typically lower in magnitude relative to program or erase pulses and typically insufficient to affect the conductive filament and/or change the state of the two-terminal memory cell. By applying a read pulse to one of the electrodes of the two-terminal memory, a measured current (e.g., Ion) can be indicative of the conductive state of the two-terminal memory cell. For example, when the conductive filament has been formed (e.g., in response to application of a program pulse), the conductance of the cell is greater than otherwise and the measured current (e.g., Ion) reading in response to the read pulse will be greater. On the other hand, when the conductive filament is removed (e.g., in response to application of an erase pulse), the resistance of the cell is high because the interface layer has a relatively high electrical resistance, so the conductance of the cell is lower and the measured current (e.g., Ioff) reading in response to the read pulse will be lower. By convention, when the conductive filament is formed, the memory cell is said to be in the "on-state" with a high conductance. When the conductive filament is not extant, the memory cell is said to be in the "off-state". A memory cell being in the on-state or the off-state can be logically mapped to binary values such as, e.g., "1" and "0". It is understood that conventions used herein associated with the state of the cell or the associated logical binary mapping is not intended to be limiting, as other conventions, including an opposite convention can be employed in connection with the disclosed subject matter. Techniques detailed herein are described and illustrated in connection with single-level cell (SLC) memory, but it is understood that the disclosed techniques can also be utilized for multi-level cell (MLC) memory in which a single memory cell can retain a set of measurably distinct states that represent multiple bits of information.

By mapping digital information to non-volatile resistance states of a two-terminal memory cell, digital information can be stored at such device. An electronic device containing many of these two-terminal memory cells can likewise store significant quantities of data. High density arrays are configured to contain as many memory cells as possible for a given area of chip space, thereby maximizing data storage capacity of a memory chip, or system-on-chip device.

For two-terminal memory formed at intersections of metal lines within a wafer (e.g., a crossbar array), the inventor(s)

of the subject disclosure are cognizant of two general conventions for arrangement of the memory cells. A first convention is the 1T1R memory array, in which each memory cell is isolated from electrical effects (e.g., current) of surrounding circuitry by an associated transistor. A second convention is the 1TnR memory array (n being a positive number greater than one), where a group of multiple memory cells is isolated from electrical effects of surrounding circuitry by one (or more) transistors. In the 1TnR context, individual memory cells in the group do not have transistors isolating the memory cells from each other, and therefore electrical isolation can be provided intrinsic to the memory cell.

Figure 7:
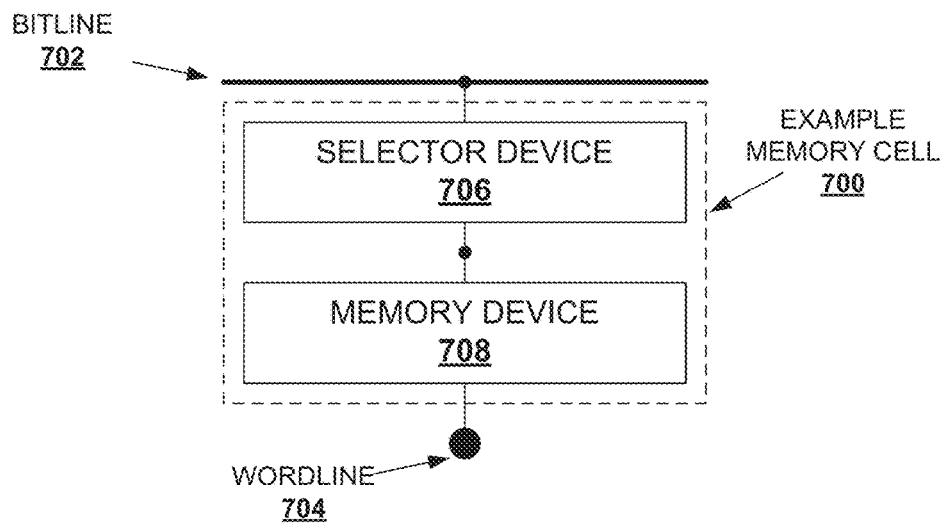
FIGS. 7 and 8 depict an example memory cell comprising a selector and memory device, and an array of such memory cells in further embodiments.

One mechanism to provide electrical isolation among memory cells in a 1TnR memory array is to provide a selector device in conjunction with a non-volatile memory device within respective memory cells (e.g., the selector device situated electrically in series with the non-volatile memory device and between the terminals of a two terminal memory cell comprising a combination of the selector device+memory device; see FIG. 7, infra). The selector device can be activated separately from the non-volatile memory device (e.g., at a different activation voltage), and can have very high on/off resistance ratios (e.g., $10^6$ or greater). When deactivated, the selector device acts to suppress current at an associated non-volatile memory device, and when activated functions similar to an electrical short.

While the selector device provides significant advantages for 1TnR memory arrays, the inventor(s) of the subject disclosure anticipate some potential challenges. First, the goal of maximizing memory density of a memory array causes chip designers to try to maximize the value of 'n' in a 1TnR memory array. Accordingly, a value for 'n' might be selected that fully utilizes the current suppression capacity of the selector device. This in turn can lead to parasitic currents in the 1TnR memory array during memory operations, presenting a possibility of bit disturbance. One mechanism to mitigate parasitic current is to reduce operational voltages. However, because the volatile selector device is configured to activate/deactivate separate from the non-volatile memory device, reduced operational voltage may result in premature deactivation of the selector device. In the context of a read operation, premature deactivation of the selector device will appear as a high resistance state, leading to misreading of the memory cell if an associated non-volatile memory device is in fact in a low resistance state.

The disclosed subject matter relates to improved techniques for reading data stored in a non-volatile memory cell. In some embodiments, an electronic circuit can include latching circuitry for an array of semiconductor memory. The latching circuitry can operate at high speeds, facilitating rapid acquisition of a data value(s) stored in a memory cell of the array. This rapid data acquisition can facilitate reduction in signal period for read signal voltages applied to the memory cell, reducing power consumption for the array, improving average memory cell longevity and improving average memory cell data retention, among other benefits. In further embodiments, the read signal can be terminated upon latching of the data value(s). Read signal termination can be implemented prior to a full read signal period. The read signal termination can occur, for instance, in response to latching circuitry acquiring a new data value after initiation of the read signal period (e.g., a high signal when initially low; a low signal when initially high, etc.) from a memory cell. When latching circuitry acquires the new data value in conjunction with a read operation, the memory cell being read is referred to herein as a latched memory cell. When a new data value is not acquired during the read signal period, the read signal can be maintained for the full read signal period. A memory cell that does not provide a new data value during the read operation (e.g., a memory cell storing a low signal when the latching circuitry is initially held low, or storing a high signal when the latching circuitry is initially held high, etc.) is referred to herein as an un-latched memory cell. In further embodiments of the present disclosure, the read signal period can include a selector device activation period sub-period, to activate a selector device component of the memory cell, and a data sensing sub-period to acquire a data value stored by a non-volatile memory component of the memory cell.

Example Enhanced Programming of a Two-Terminal Memory Cell

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring initially to FIG. 1, a schematic diagram of a sample memory array 100 is illustrated comprising a set of bitlines 102 and a set of wordlines 104. At respective intersections of bitlines 102 and wordlines 104 are two-terminal non-volatile memory cells. Respective two-terminal non-volatile memory cells are arranged in a two-dimensional matrix connected to one of bitlines 102 and one of wordlines 104. By applying an operational signal (e.g., read signal, write signal, erase signal, etc.) to one of bitlines 102 and one of wordlines 104, a single two-terminal non-volatile memory cell of the matrix can be targeted for an operation.

Also depicted by FIG. 1 are a set of waveforms 106. Waveforms 106 include signals utilized for a read operation of memory array 100, according to various embodiments of the present disclosure. The top signal of waveforms 106 is a read signal for an un-latched memory cell on a selected bitline (selected BL, un-latched signal 108). The next signal from the top of waveforms 106 is a read signal for a latched memory cell on the selected bitline (selected BL, latched signal 130). The third signal from the top of waveforms 106 is a selected wordline signal 132, and the last signal is an un-selected bitline/un-selected wordline signal 134. A timeline 120 provides an initial state for each of waveforms 106. In an embodiment, timeline 120 can correspond with a start of a read operation period for memory array 100. As illustrated, each of waveforms 106 is set at an initial voltage for the read operation. In one embodiment, the initial voltage can be 1.3 or about 1.3 volts. It should be appreciated that other initial voltages may be suitable as well, depending on the operating voltages of the two-terminal non-volatile memory cells of memory array 100, selected from a range between about 0.8 volts and about 2.0 volts, in various embodiments.

Figure 2:
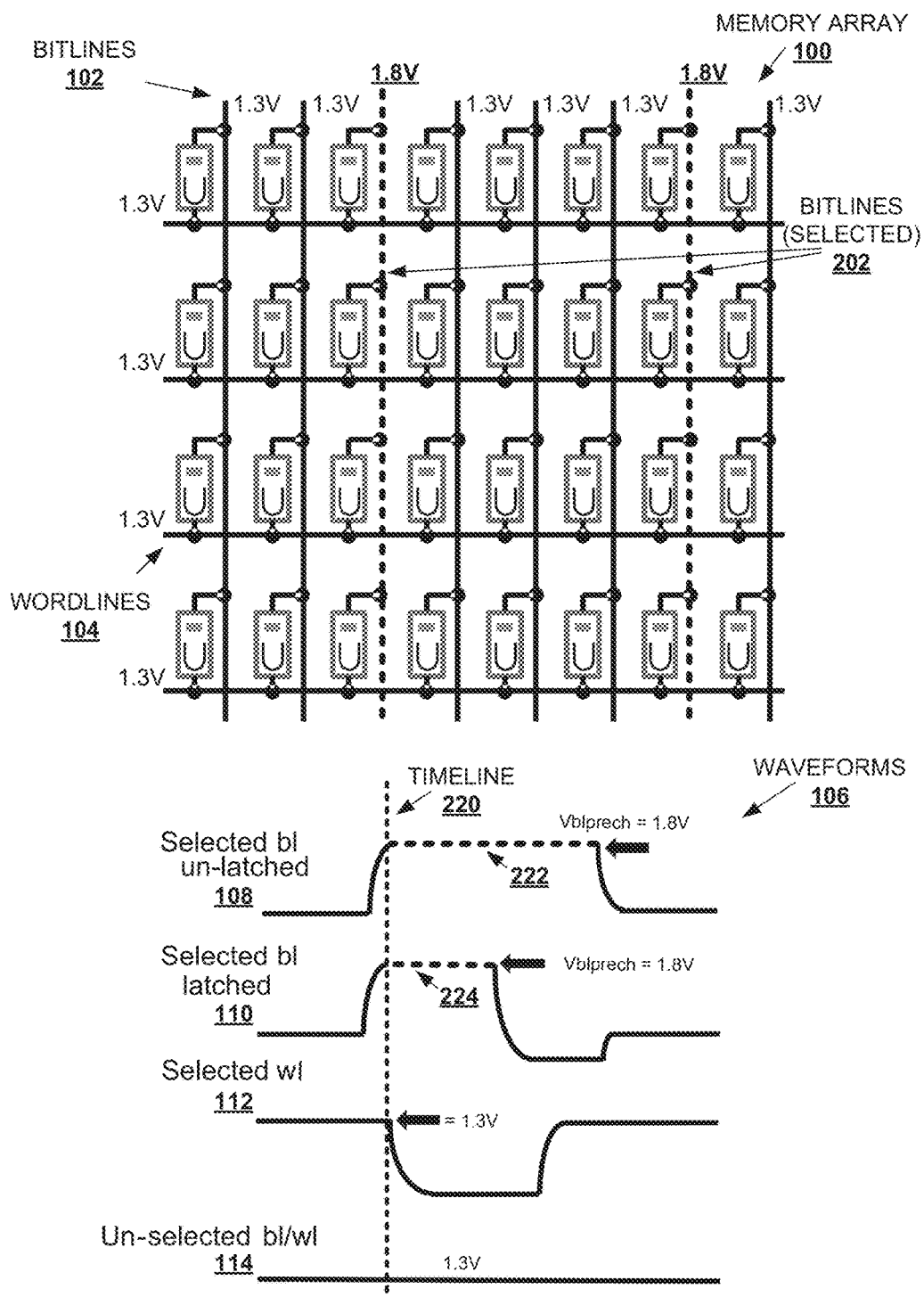
FIG. 2 depicts a diagram of a second stage of the example read operation according to further embodiments disclosed herein.

Turning to FIG. 2, memory array 100 is depicted with waveforms 106 at a second timeline 220. Selected BL signals (including selected BL, un-latched signal 108 and selected BL, latched signal 130) are increased from the initial voltage to a precharge voltage. These signals are applied respectively to two selected bitlines 202 (depicted by dotted vertical lines of memory array 100). Other numbers of selected bitlines 202 can be utilized, for instance a suitable positive number greater than zero. For the example depicted by FIG. 2, the precharge voltage can be (about) 1.8 volts, though other voltages can be employed for the precharge voltage in various embodiments (e.g., selected from a range of about 1.3 to about 2.5 volts, depending on operating characteristics of the two-terminal non-volatile memory cells). A latching circuit (not depicted, but see FIG. 12, infra, as one example) can be connected to each of bitlines 102, or selectively to the selected bitlines 202 at timeline 220, in an embodiment.

Figure 3:
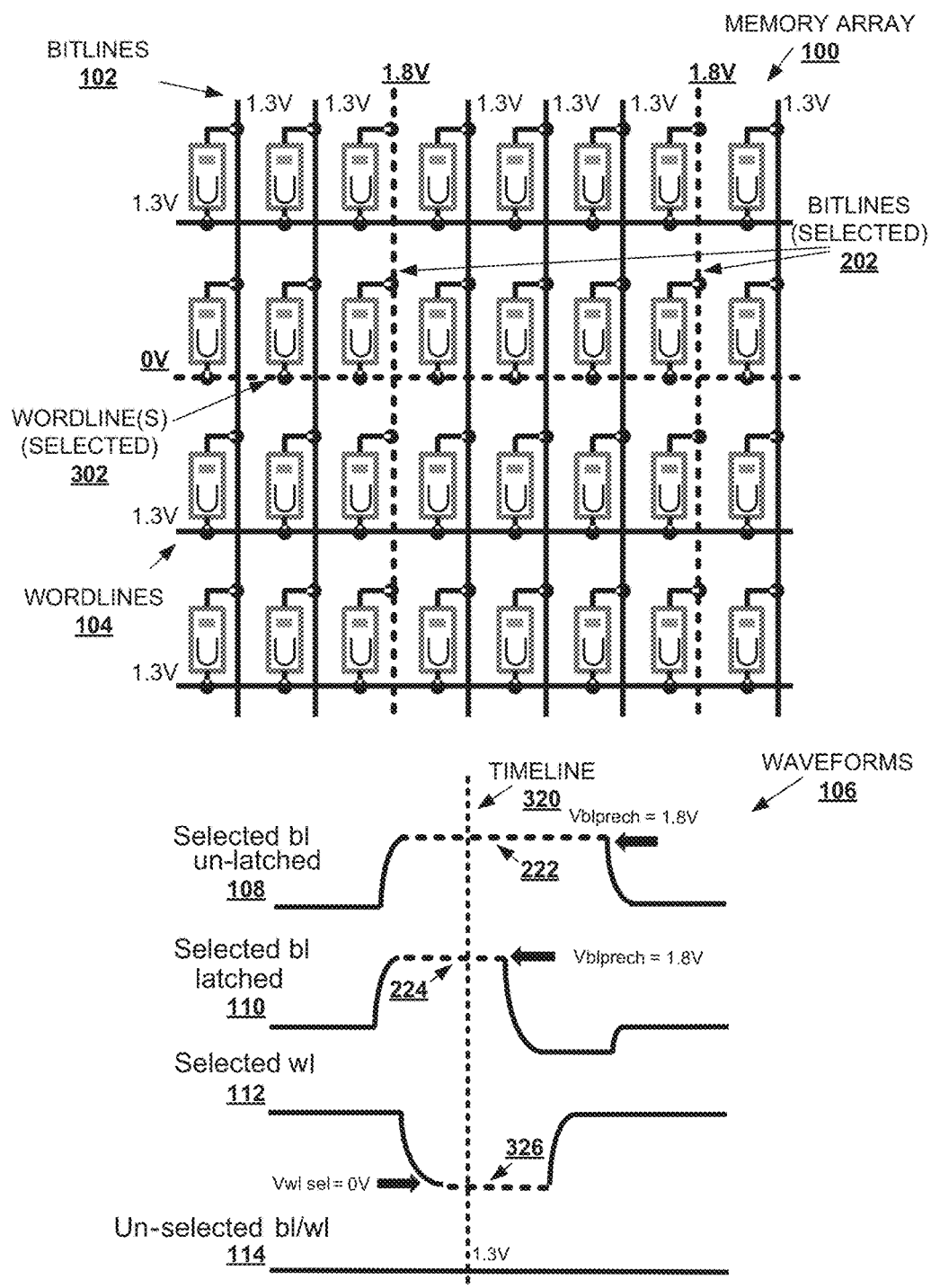
FIG. 3 depicts an illustration of a third stage of the example read operation in another embodiment of the subject disclosure.

At FIG. 3, waveforms 106 are advanced according to a third timeline 320. For third timeline 320, selected BL, un-latched signal 108 and selected BL, latched signal 130 are maintained at the precharge voltage. Selected wordline signal 132 is applied to a selected wordline(s) 302 of memory array 100 (depicted by a dotted horizontal line of memory array 100). The selected wordline signal 132 can be (about) 0 volts, or ground, in some embodiments, through other voltages can be employed sufficient to apply a potential difference equal to a read voltage (e.g., about 1.8 volts, a voltage in a range selected from about 1.0 volts to about 2.5 volts, or other suitable voltage magnitude) is applied to memory cells connected to (one of) selected wordline(s) 302 and to either selected bitline 202. In an embodiment, the latching circuit can be connected to selected wordline(s) 302 rather than selected bitlines 202. In this latter embodiment, a single selected bitline 202 would be employed, with one (or more) selected wordlines 302.

Figure 4:
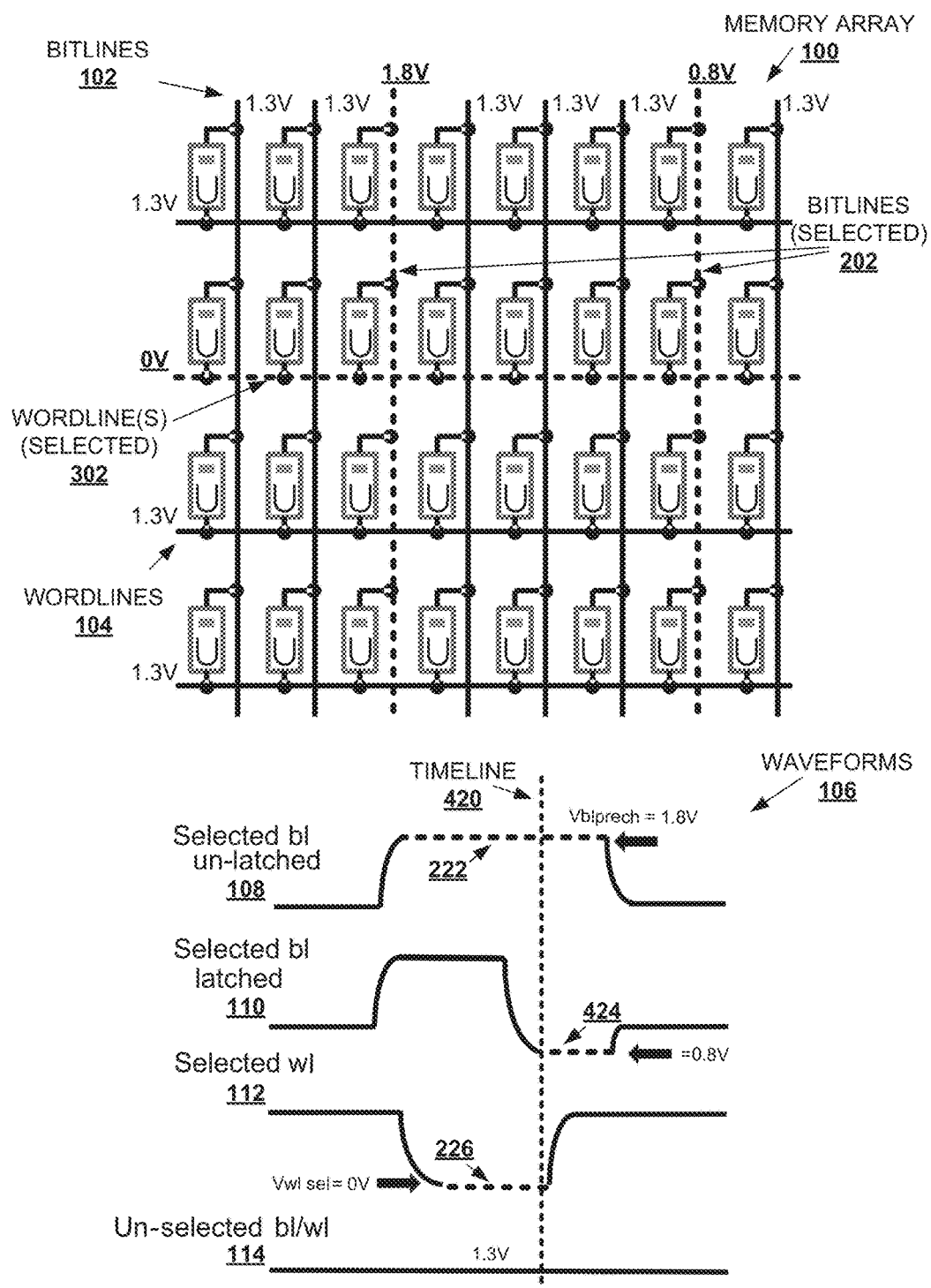
FIG. 4 depicts an illustration of a fourth stage of the example read operation according to still other embodiments.

FIG. 4 depicts waveforms 106 at a fourth timeline 420. At fourth timeline 420, the latching circuit has acquired a new value (e.g., a high signal compared with an initial low signal; a low signal compared to an initial high signal) from one of selected bitlines 202. As a result, selected BL, latched signal 130 is decreased from the precharge voltage to a lower voltage (e.g., 0.8 volts or about 0.8 volts, or other suitable value) to reduce a potential difference across the latched bitline and latched memory cell. This lower voltage can be maintained for a duration of a read operation period, lowering power consumption, reducing current through the latched memory cell and, on average, reducing exposure of memory array 100 to higher operational voltages. A second of selected bitlines 202 has not produced a new value at the latching circuit, and therefore the selected BL, un-latched signal 108 remains constant at the precharge voltage. Selected wordline signal 132 remains the same (e.g., at 0 or about 0 volts), as does un-selected bitline/un-selected wordline signal 134 (at the initial voltage).

Figure 5:
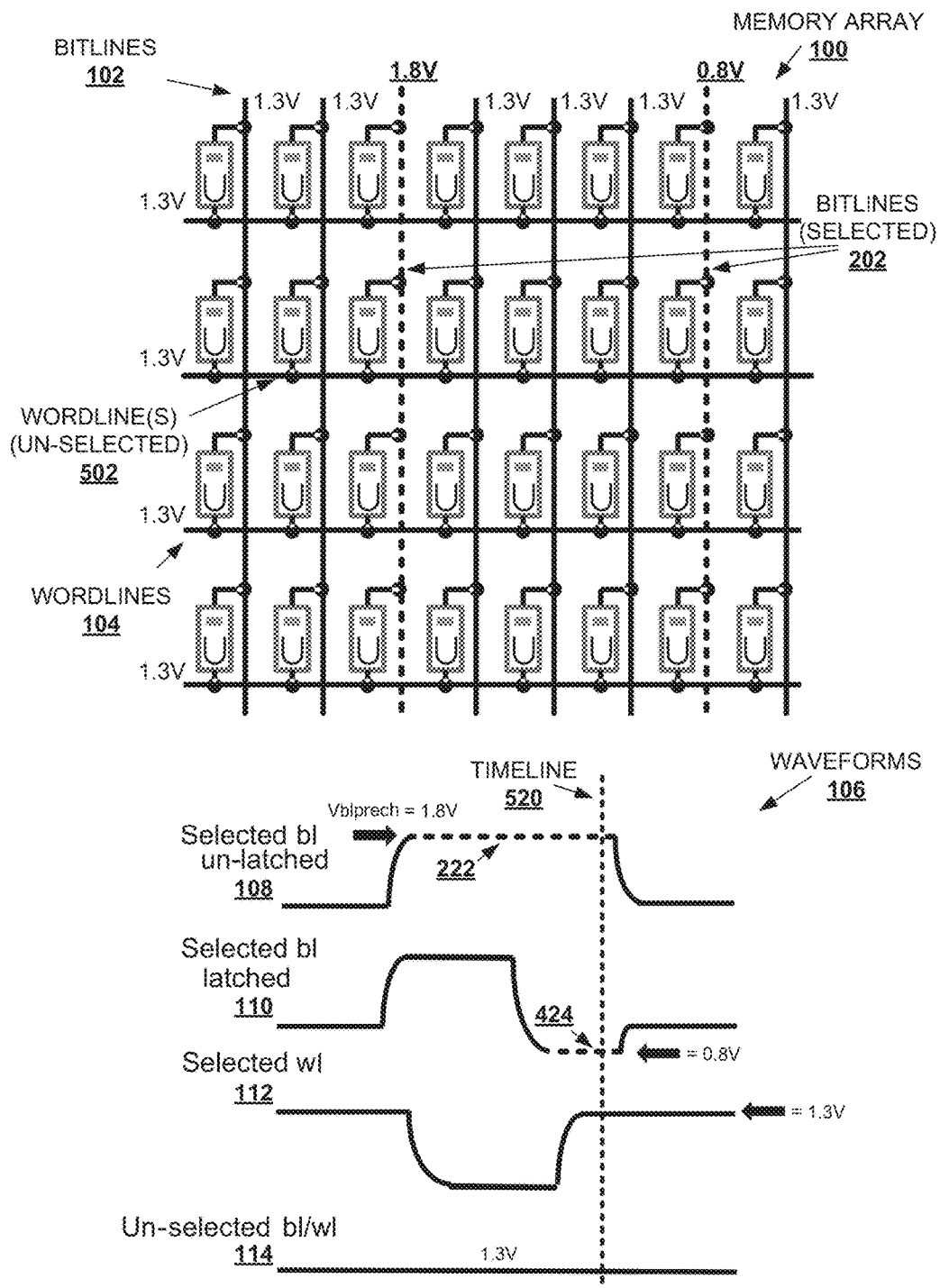
FIG. 5 depicts a diagram of a fifth stage of the example read operation for in an embodiment(s)

FIG. 5 illustrates waveforms 106 at a fifth timeline 520. At fifth timeline 520, selected wordline signal 132 is increased in magnitude, e.g., to the initial voltage. Selected BL, un-latched signal 108 is maintained at the precharge voltage, selected BL, latched signal 130 is maintained at the lower voltage, and un-selected bitline/un-selected wordline signal 134 is maintained at the initial voltage.

Figure 6:
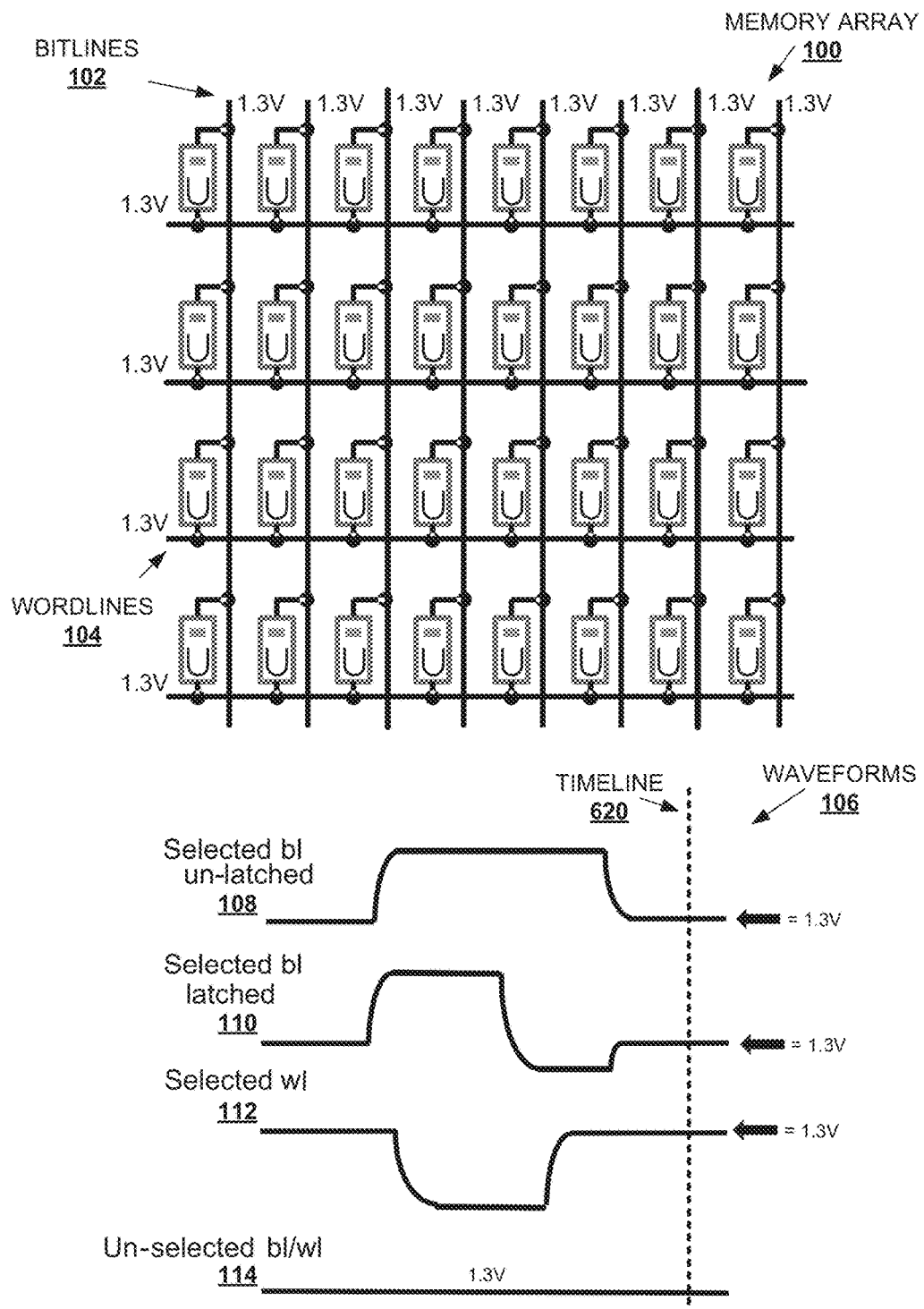
FIG. 6 provides an illustration of a final stage of the example read operation for the array of memory cells, in at least one additional embodiment.

At FIG. 6, there is depicted a sixth timeline 620 for waveforms 106. At sixth timeline 620, each of waveforms is returned to the initial state (from first timeline 120). Sixth timeline 620 can correspond with an end of the read operation period, in an embodiment.

FIG. 7 illustrates a block diagram of an example memory cell 700 according to one or more embodiments. Example memory cell 700 can be a two-terminal non-volatile memory cell, in various embodiments. In at least one embodiment, example memory cell 700 can be utilized for one or more of the memory cells incorporated into memory array 100. As illustrated, example memory cell 700 can comprise a first terminal connected to a bitline 702, and a second terminal connected to a wordline 704 (the wordline 704 extending in and out of the page, in the example depicted by FIG. 7, though wordline 704 can extend in another direction that is not normal to the page).

In the embodiment of FIG. 7, example memory cell 700 can comprise two components. A first component is a selector device component 706, and a second component is a memory device component 708. Selector device component 706 can be a volatile resistive switching device having a high electrical resistance in a deactivated state, and a low electrical resistance in an activated state. In an embodiment, selector device component 706 can be a FAST selector device in development by the assignee of the present application for patent (e.g., see U.S. application Ser. No. 14/588,185 entitled SELECTOR DEVICE FOR TWO-TERMINAL MEMORY and filed Dec. 31, 2014, incorporated by reference hereinabove). Memory device component 708 can be a two-terminal non-volatile memory device. Examples of suitable such devices can include non-volatile resistive switching devices, phase change memory devices (PC-RAM), magneto-resistive memory devices (MRAM), conductive bridging memory devices (CB-RAM), among other suitable devices. Memory device component 708 can be programmed to a relatively low resistance state, or erased to a relatively high resistance state. In various embodiments, the low resistance state of selector device component 706 can have lower electrical resistance than the relatively low resistance state of memory device component 708, or the high resistance state of selector device component 706 can have higher electrical resistance than the relatively high resistance state of memory device component 708, or a combination of the foregoing. Further, selector device component 706 can be activated at a voltage that is less than a program (or erase) voltage of memory device component 708, and can be deactivated at greater than zero volts (e.g., at about 0.8 volts, about 0.5 volts, or other suitable voltage greater than zero volts). In some embodiments, an activation voltage for selector device component 706 can be approximately equal to or less than a read voltage associated with memory device component 708 (e.g., an activation voltage approximately equal to or less than about 1.8 volts, among others). Accordingly, once selector device component 706 is activated and in the low resistance state, a majority of voltage applied to example memory cell 700 can be dropped across memory device component 708, allowing voltage, field or current-based operations to implemented on memory device component 708.

Figure 8:
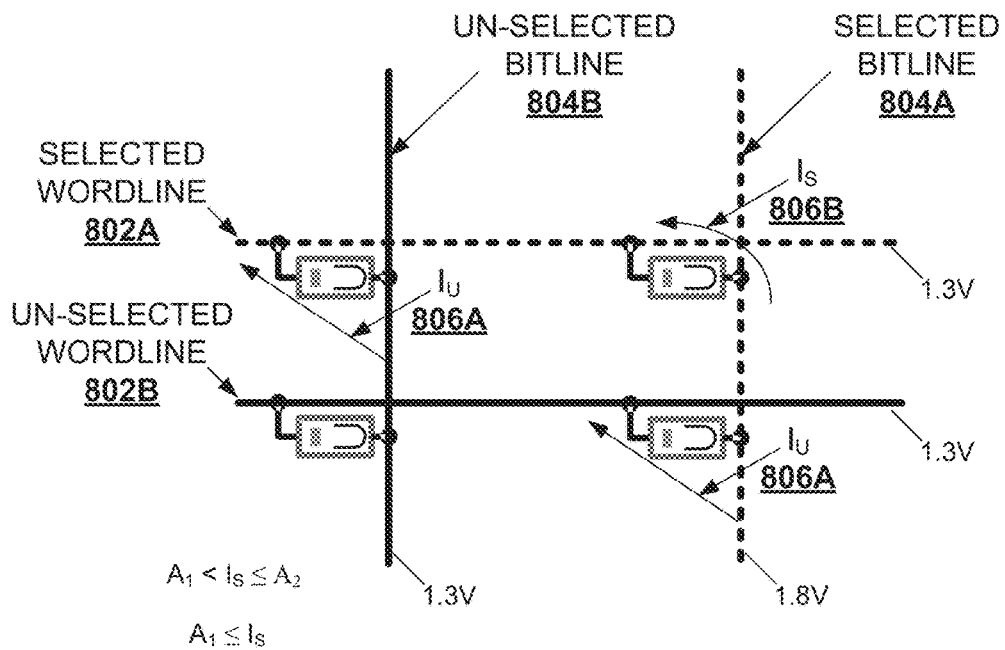

FIG. 8 depicts a schematic diagram of an example memory array 800 comprising example memory cells 700. Memory array 800 comprises a set of wordlines, including a selected wordline 802A and an un-selected wordline 802B, as well as a set of bitlines, including a selected bitline 804A and an un-selected bitline 804B. Respective intersections of the set of wordlines and bitlines comprise one of example memory cells 700. Voltages applied to memory array 800 are exemplary only, and not intended to limit the scope of the present disclosure, as other voltages suitable to operate example memory cells 700 can be employed within the scope of the disclosure. For the example depicted by FIG. 8, 1.3 volts is applied to un-selected wordline 802B and un-selected bitline 804B. Selected bitline 804A has a voltage in a range of about 1.5 volts to about 2.0 volts (e.g., 1.8 volts), and selected wordline 802A is cycled from about 0 volts to a second voltage in a range of about 1.0 volts to about 1.5 volts (e.g., 1.3 volts; see, e.g., selected wordline 914 of FIG. 9, infra), applying a maximum voltage in a third range of about 1.5 volts to about 2.0 volts (e.g., about 1.8 volts) across the memory cell at selected bitline 804A and selected wordline 802A. The maximum voltage in the third range (e.g., about 1.8 volts) can activate a selector device component of the memory cell at selected bitline 804A and selected wordline 802A, causing a selected memory cell current L 806B to flow through this memory cell. No more than the second voltage range (e.g., 1.3 volts) is observed by the second memory cell on selected wordline 802A, and no more than about zero volts to about 1.0 volts (e.g., 0.5 volts) is observed by a third memory cell at selected bitline 804A and un-selected wordline 802B. These memory cells conduct smaller currents, less than L 806B (equal to or less than an unselected current, $I_u$ 806A). The memory cell at un-selected bitline 804B and un-selected wordline 802B observes no appreciable voltage, and conducts relatively no current.

Figure 9:
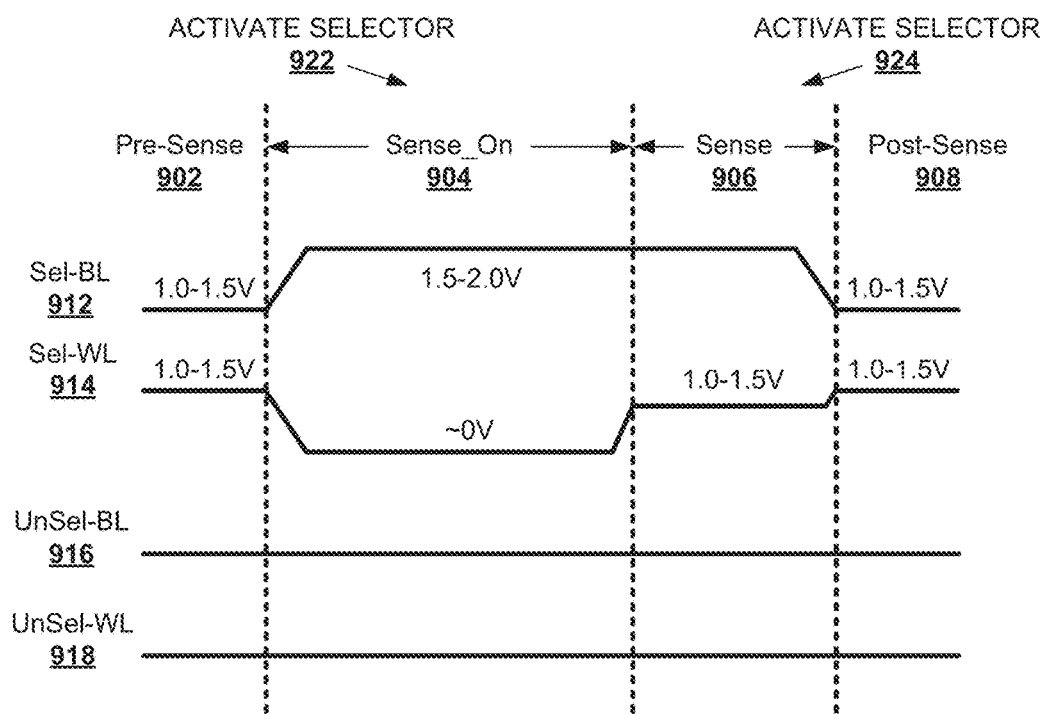
FIG. 9 depicts an example graph that plots voltage over time related to a read operation for an array of memory cells, in an embodiment(s)

FIG. 9 illustrates a diagram of an example read operation 900 for a memory cell, according to alternative or additional embodiments of the present disclosure. Read operation 900 includes a pre-sense phase 902, a selector activation phase 904, a sensing phase 906 and a post-sense phase 908. Several signals are provided for the read operation 900, including selected bitline signal 912, selected wordline signal 914, un-selected bitline signal 916 and un-selected wordline signal 918 (referred to collectively as read signals 912-918). During the pre-sense phase 902, an initial voltage of about 1.3 volts (or other suitable initial voltage, such as a voltage in a range of about 1.0 volts to about 1.5 volts) is provided for the read signals 912-918. During selector activation phase 904, selected bitline signal 912 is increased to a range from about 1.5 volts to about 2.0 volts (e.g., about 1.8 volts) and selected wordline signal 914 is decreased (e.g., to about 0 volts). The potential difference applied across a memory cell by selected bitline signal 912 and selected wordline signal 914 is configured to activate a selector device component of a memory cell. Selector activation phase 904 can result in activation of a selector device 922. During sensing phase 906, selected wordline signal 914 is increased to holding voltage in a range of about 0.8 to about 1.3 volts (e.g., 1.3 volts) configured to maintain activation of the selector device, at least when a resistive storage device of the memory cell is in a low resistance state (e.g., in an embodiment, the selector device can deactivate at the hold voltage when the resistive storage device is in a high resistance state, providing far less current through the memory cell and greater sensing margin for differentiating the high resistance storage device from the low resistance storage device). In response to a latch circuit capturing data 926 from the memory cell, selected bitline 912 is decreased to a range of about 1.0 to about 1.5 volts (e.g., about 1.3 volts). Latching of the data 926 and reduction of selected bitline signal 912 can occur prior to a predetermined duration of read operation 900, in various embodiments. During post-sense phase, read signals 912-918 are returned to the initial voltage (if not already at the initial voltage), and the read operation 900 is complete.

Example Methods for Enhanced Programming of a Two-Terminal Memory Cell

The diagrams included herein are described with respect to interaction between several memory cells, memory cell components, or memory architectures. It should be appreciated that such diagrams can include those memory cells, components and architectures specified therein, some of the specified memory cells/components/architectures, or suitable alternative or additional memory cells/components/architectures. Sub-components can also be implemented as electrically connected to other sub-components rather than included within a parent architecture. Moreover, some of the disclosed embodiments can be implemented as part(s) of other disclosed embodiments where suitable (e.g., memory cells of memory cell array 100 of FIG. 1 can comprise respective selector device components 706 and memory device components 708, as provided by FIG. 7). Additionally, it is noted that one or more disclosed processes can be combined into a single process providing aggregate functionality. For instance, a program process can comprise an erase process, or vice versa, to facilitate programming and erasing a semiconductor cell by way of a single process. In addition, it should be appreciated that respective rows of multiple cell memory architectures can be erased in groups (e.g., multiple rows erased concurrently) or individually. Moreover, it should be appreciated that multiple memory cells on a particular row can be read or programmed in groups (e.g., multiple memory cells read/programmed concurrently) or individually. Components of the disclosed architectures can also interact with one or more other components not specifically described herein but known by those of skill in the art or made evident by way of the context provided herein.

Figure 10:
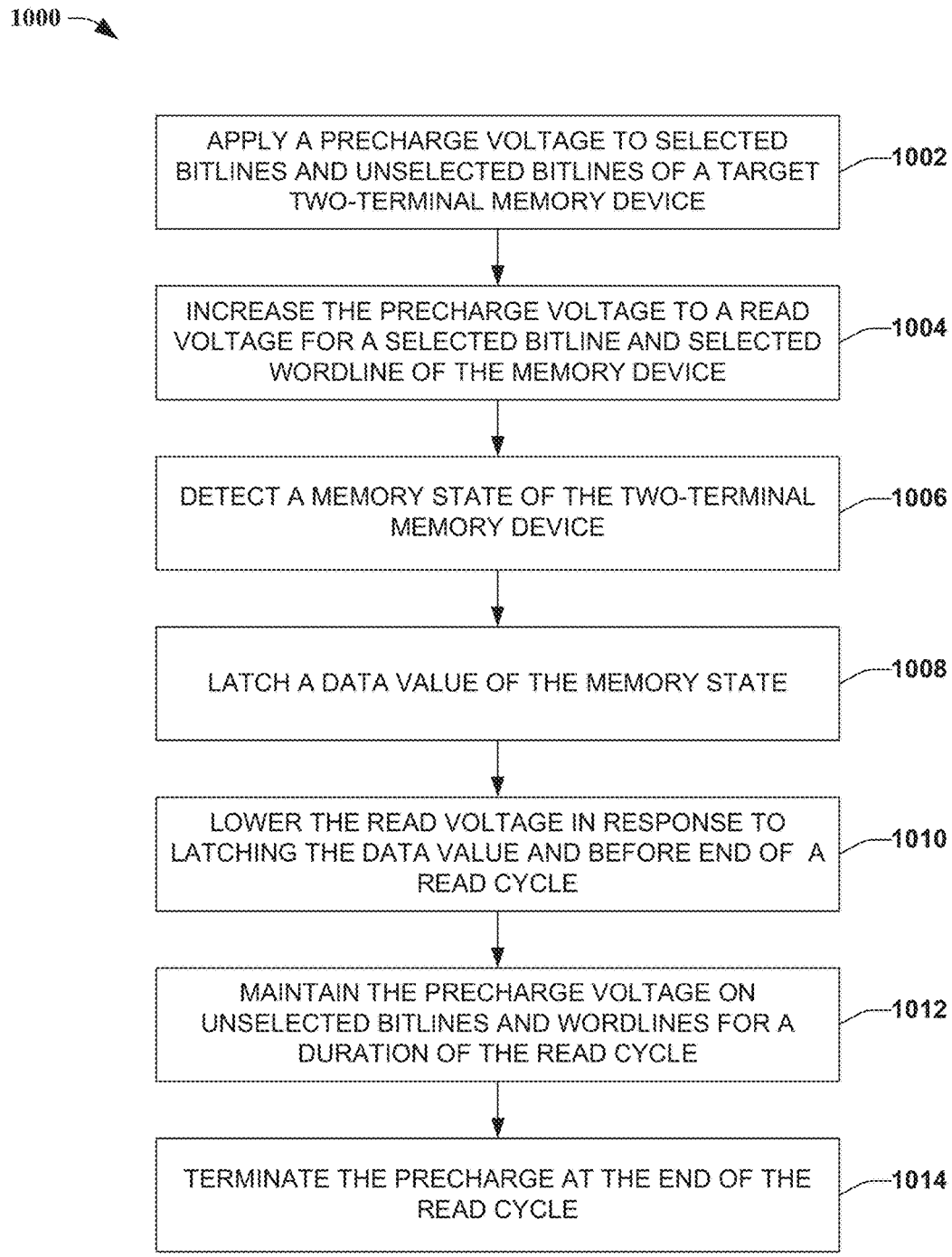
FIG. 10 illustrates a flowchart of a sample method for implementing a read operation for an array of two-terminal memory devices, in further embodiments.
Figure 11:
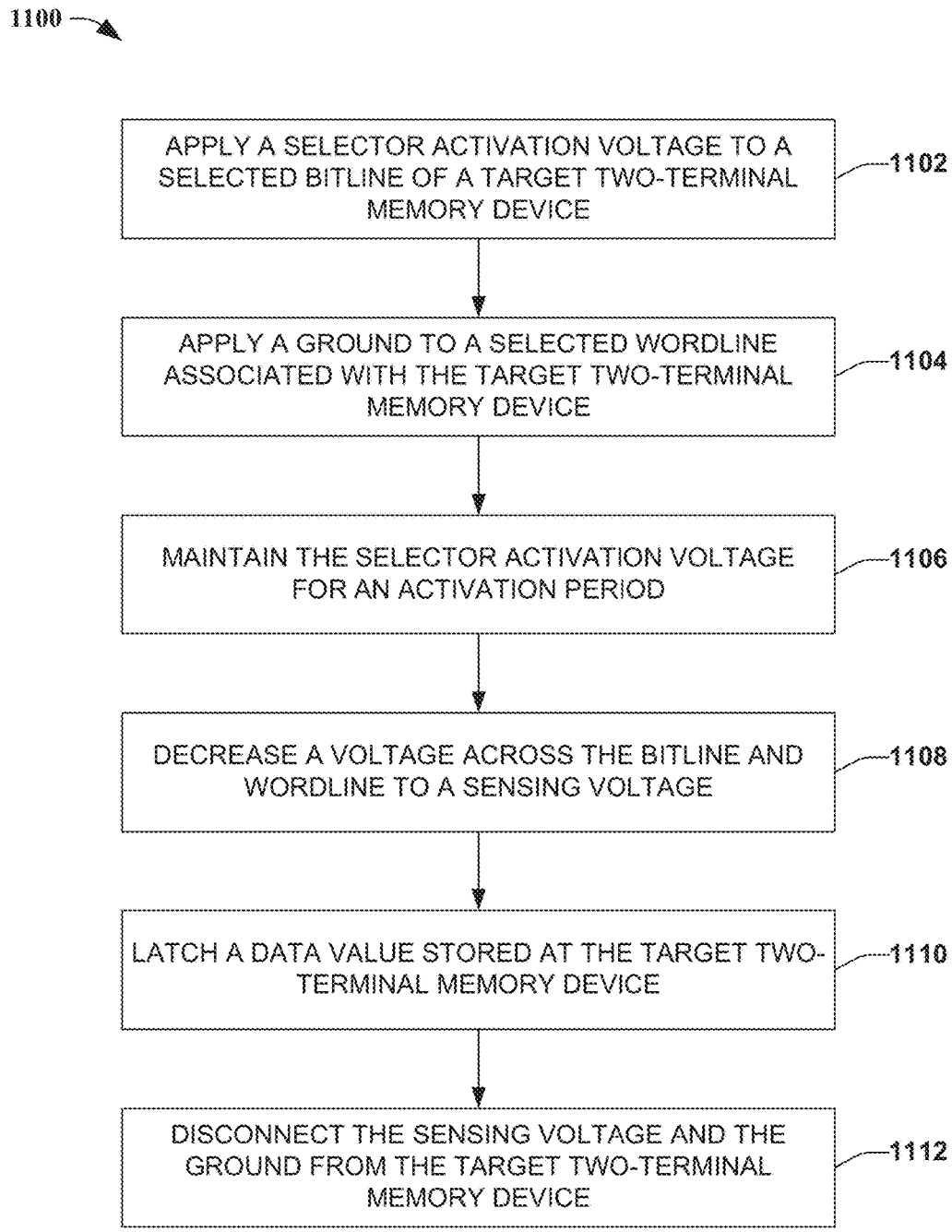

In view of the exemplary diagrams described supra, process methods that can be implemented in accordance with the disclosed subject matter will be better appreciated with reference to the flow charts of FIGS. 10-11. While for purposes of simplicity of explanation, the methods of FIGS. 10-11 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Referring now to FIG. 10, a method 1000 for operating a memory cell of a memory array is provided. Method 1000 can comprise, at 1002, applying a precharge voltage to selected bitlines and unselected bitlines of a target two-terminal memory device. At 1004, method 1000 can comprise increasing the precharge voltage to a read voltage for a selected bitline and selected wordline of the memory device. At 1006, method 1000 can comprise detecting a memory state of the two-terminal memory device and, at 1008, method 1000 can comprise latching a data value of the memory state. Furthermore, at 1010, method 1000 can comprise lowering the read voltage in response to latching the data value while maintaining the precharge voltage on unselected bitlines and wordlines. In an embodiment, the lowering can be implemented immediately after latching the data value, or in another embodiment a predetermined time after latching the data value. At 1012, method 1000 can comprise maintaining the precharge voltage for a duration of a read cycle, and at 1014, method 1000 can comprise terminating the precharge at an end of the read cycle.

FIG. 11 depicts a method 1100 for reading a memory cell according to one or more additional embodiments of the present disclosure. At 1102, method 1100 can comprise applying a selector activation voltage to a selected bitline of a target two-terminal memory device. At 1104, method 1100 can comprise applying a ground (or zero volts) to a selected wordline associated with the target two-terminal memory device, and at 1106, method 1100 can comprise maintaining the selector activation voltage for an activation period. At 1108, method 1100 can comprise decreasing a voltage across the bitline and wordline to a sensing voltage (e.g., following the activation period). At 1110, method 1100 can comprise latching a data value stored at the target two-terminal memory device. Further, at 1112, method 1100 can comprise disconnecting the sensing voltage and the ground from the target two-terminal memory device.

Example Operating Environments

Figure 12:
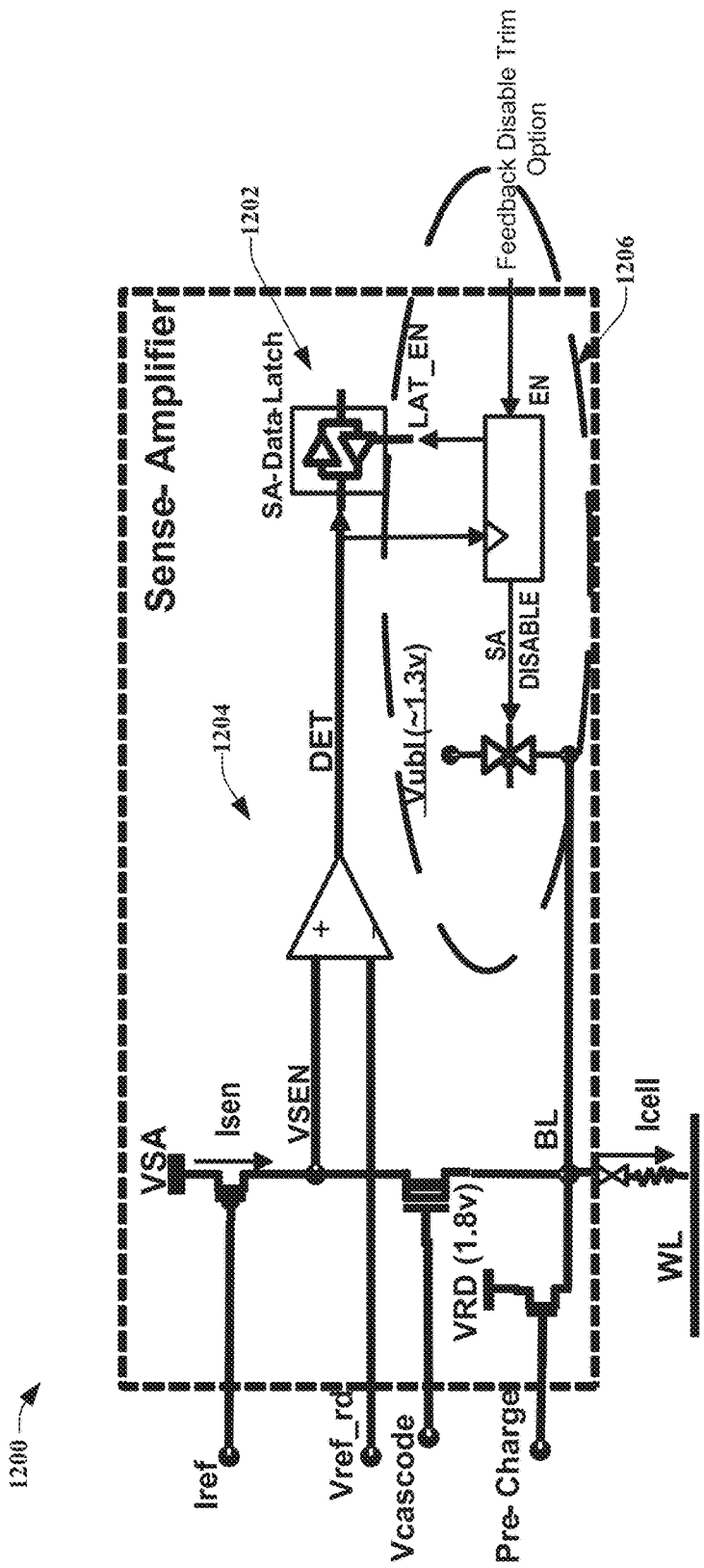
FIG. 12 depicts a circuit diagram of an example sense amplifier and data latch for facilitating a read operation for a memory array in some disclosed embodiments.

FIG. 12 illustrates a schematic diagram of an example latching circuit 1200 according to one or more additional embodiments of the present disclosure. Latching circuit 1200 can be employed to quickly receive and hold a data value of a target memory cell, in conjunction with reading the memory cell. Latching circuit 1200 can facilitate output of the data value in response to reading the memory cell. As illustrated, latching circuit 1200 can comprise a data latch circuit 1202. In an embodiment, data latch circuit 1202 can comprise a set of paired amplifiers (e.g., each having an output connected to an input of the other amplifier), though other suitable circuit components can be employed for data latch circuit 1202. Additionally, latching circuit 1200 can comprise an amplifier circuit 1204, and a feedback disable circuit 1206, configured to interrupt read signal termination for amplifier circuit 1204.

In various embodiments, feedback disable circuit 1206 can be enabled and in response amplifier circuit 1204 can operate a read sensing scheme without feedback termination. Accordingly, with feedback disable circuit 1206 activated, a read signal of a read operation can be maintained for a default duration of the read operation. When feedback disable circuit 1206 is deactivated, the signal termination (e.g., in response to latching of a data value) described herein can be implemented as part of the read operation. In the latter case, amplifier circuit 1204 can latch a read result, disable the amplifier circuit (e.g., to save power), and force selected-bitline to unselected-bitline voltage (VUBL) or a safe-voltage (e.g., to prevent read disturb).

Figure 13:
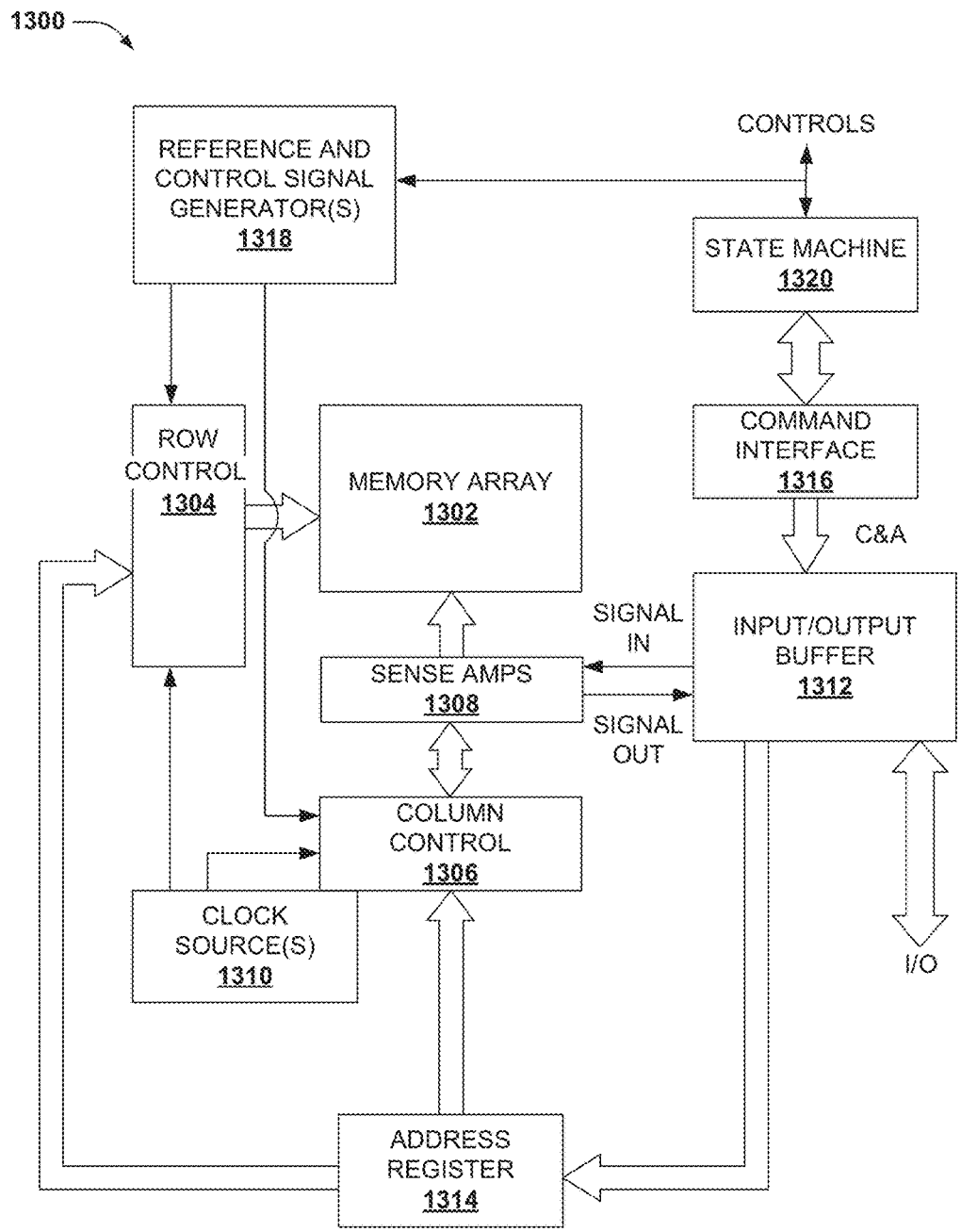
FIG. 13 illustrates depicts a flowchart of a sample method for implementing a read operation according to still other embodiments.

In order to provide a context for the various aspects of the disclosed subject matter, FIG. 13, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory (e.g. CF card, USB memory stick, SD card, microSD card), or the like. In a distributed computing environment, program modules can be located in both local and remote memory storage modules or devices.

FIG. 13 illustrates a block diagram of an example operating and control environment 1300 for a memory array 1302 of a multi-bank memory cell array according to aspects of the subject disclosure. In at least one aspect of the subject disclosure, memory array 1302 can comprise memory selected from a variety of memory cell technologies. In at least one embodiment, memory array 1302 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing. In yet another embodiment, memory array 1302 can be configured to operate according to a read operation as provided herein.

A column controller 1306 and sense amps 1308 can be formed adjacent to memory array 1302. Moreover, column controller 1306 can be configured to activate (or identify for activation) a subset of bitlines of memory array 1302. Column controller 1306 can utilize a control signal provided by a reference and control signal generator(s) 1318 to activate, as well as operate upon, respective ones of the subset of bitlines, applying suitable program, erase or read voltages to those bitlines. Non-activated bitlines can be kept at an inhibit voltage (also applied by reference and control signal generator(s) 1318), to mitigate or avoid bit-disturb effects on these non-activated bitlines.

In addition, operating and control environment 1300 can comprise a row controller 1304. Row controller 1304 can be formed adjacent to and electrically connected with word lines of memory array 1302. Further, utilizing control signals of reference and control signal generator(s) 1318, row controller 1304 can select particular rows of memory cells with a suitable selection voltage. Moreover, row controller 1304 can facilitate program, erase or read operations by applying suitable voltages at selected word lines.

Sense amps 1308 can read data from, or write data to the activated memory cells of memory array 1302, which are selected by column control 1306 and row control 1304. Data read out from memory array 1302 can be provided to an input and input/output buffer 1312 (e.g., an LPDDR buffer, in some embodiments). Likewise, data to be written to memory array 1302 can be received from the input and input/output buffer 1312 and written to the activated memory cells of memory array 1302.

A clock source(s) 1310 can provide respective clock pulses to facilitate timing for read, write, and program operations of row controller 1304 and column controller 1306. Clock source(s) 1310 can further facilitate selection of wordlines or bitlines in response to external or internal commands received by operating and control environment 1300. Input and input/output buffer 1312 can comprise a command and address input, as well as a bidirectional data input and output. Instructions are provided over the command and address input, and the data to be written to memory array 1302 as well as data read from memory array 1302 is conveyed on the bidirectional data input and output, facilitating connection to an external host apparatus, such as a computer or other processing device (not depicted, but see e.g., computer 1402 of FIG. 14, infra).

Input and input/output buffer 1312 can be configured to receive write data, receive an erase instruction, receive a status or maintenance instruction, output readout data, output status information, and receive address data and command data, as well as address data for respective instructions. Address data can be transferred to row controller 1304 and column controller 1306 by an address register 1310. In addition, input data is transmitted to memory array 1302 via signal input lines between sense amps 1308 and input and input/output buffer 1312, and output data is received from memory array 1302 via signal output lines from sense amps 1308 to input and input/output buffer 1312. Input data can be received from the host apparatus, and output data can be delivered to the host apparatus via the I/O bus.

Commands received from the host apparatus can be provided to a command interface 1316. Command interface 1316 can be configured to receive external control signals from the host apparatus, and determine whether data input to the input and input/output buffer 1312 is write data, a command, or an address. Input commands can be transferred to a state machine 1320.

State machine 1320 can be configured to manage programming and reprogramming of memory array 1302 (as well as other memory banks of the multi-bank memory array). Instructions provided to state machine 1320 are implemented according to control logic configurations, enabling state machine 1320 to manage read, write, erase, data input, data output, and other functionality associated with memory array 1302. In some aspects, state machine 1320 can send and receive acknowledgments and negative acknowledgments regarding successful receipt or execution of various commands. In further embodiments, state machine 1320 can decode and implement status-related commands, decode and implement configuration commands, and so on.

To implement read, write, erase, input, output, etc., functionality, state machine 1320 can control clock source(s) 1308 or reference and control signal generator(s) 1318. Control of clock source(s) 1308 can cause output pulses configured to facilitate row controller 1304 and column controller 1306 implementing the particular functionality. Output pulses can be transferred to selected bitlines by column controller 1306, for instance, or wordlines by row controller 1304, for instance.

Figure 14:
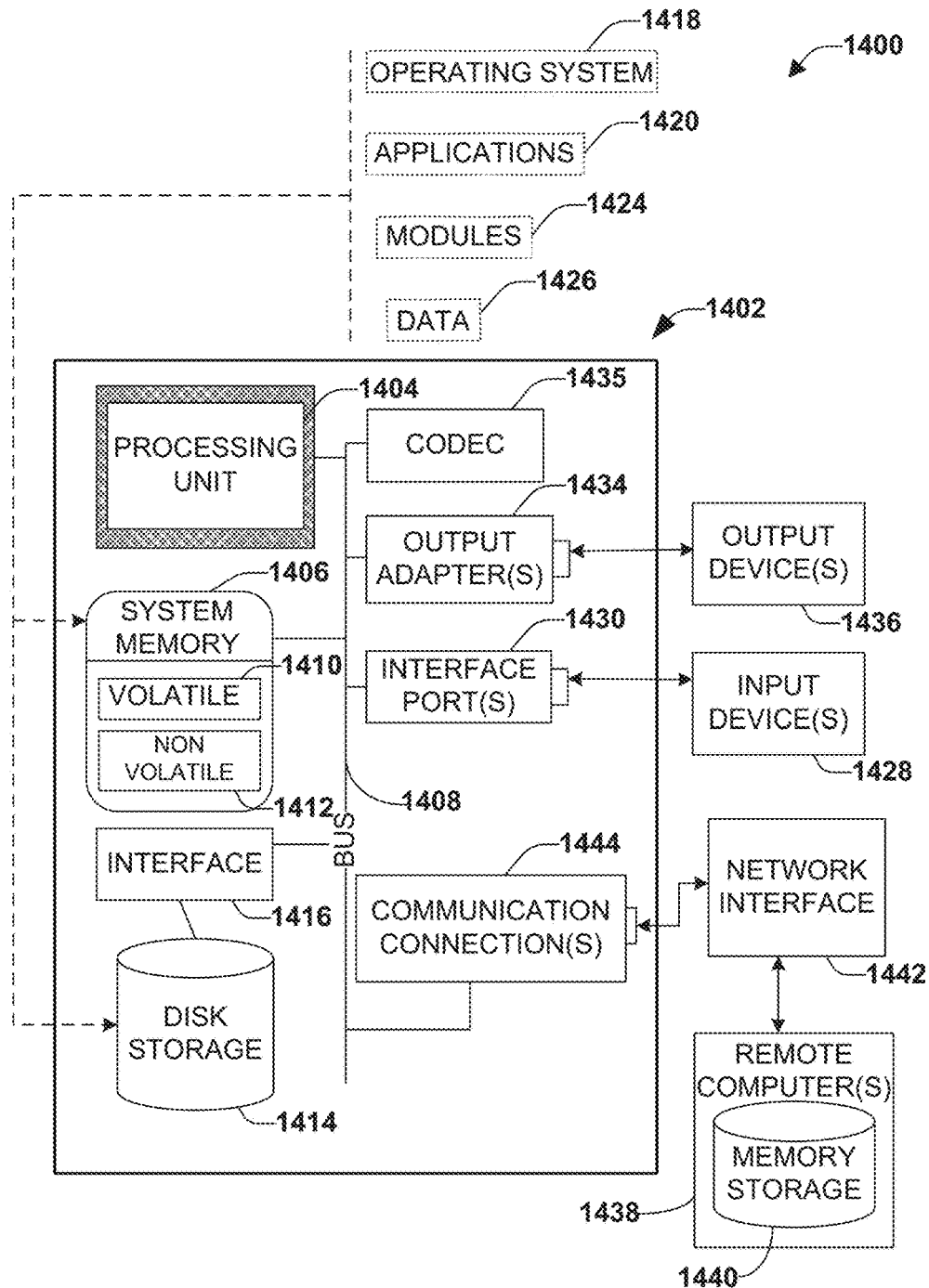
FIG. 14 illustrates a block diagram of an example computing environment in accordance with certain embodiments of this disclosure.

With reference to FIG. 14, a suitable environment 1400 for implementing various aspects of the claimed subject matter includes a computer 1402. The computer 1402 includes a processing unit 1404, a system memory 1406, a codec 1435, and a system bus 1408. The system bus 1408 couples system components including, but not limited to, the system memory 1406 to the processing unit 1404. The processing unit 1404 can be any of various available processors. Dual microprocessors and other multiprocessor architectures also can be employed as the processing unit 1404.

The system bus 1408 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1406 includes volatile memory 1410 and non-volatile memory 1412. The basic input/output system (BIOS), containing the basic routines to transfer information between elements within the computer 1402, such as during start-up, is stored in non-volatile memory 1412. In addition, according to present innovations, codec 1435 may include at least one of an encoder or decoder, wherein the at least one of an encoder or decoder may consist of hardware, software, or a combination of hardware and software. Although, codec 1435 is depicted as a separate component, codec 1435 may be contained within non-volatile memory 1412. By way of illustration, and not limitation, non-volatile memory 1412 can include read only memory (ROM), programmable ROM (PROM), electrically programmable ROM (EPROM), electrically erasable programmable ROM (EEPROM), or flash memory. Volatile memory 1410 includes random access memory (RAM), which acts as external cache memory. According to present aspects, the volatile memory may store the write operation retry logic (not shown in FIG. 14) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 1402 may also include removable/non-removable, volatile/non-volatile computer storage medium. FIG. 14 illustrates, for example, disk storage 1414. Disk storage 1414 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1414 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1414 to the system bus 1408, a removable or non-removable interface is typically used, such as interface 1416. It is appreciated that storage devices 1414 can store information related to a user. Such information might be stored at or provided to a server or to an application running on a user device. In one embodiment, the user can be notified (e.g., by way of output device(s) 1436) of the types of information that are stored to disk storage 1414 and/or transmitted to the server or application. The user can be provided the opportunity to opt-in or opt-out of having such information collected and/or shared with the server or application (e.g., by way of input from input device(s) 1428).

It is to be appreciated that FIG. 14 describes software that acts as an intermediary between users and the basic computer resources described in the suitable operating environment 1400. Such software includes an operating system 1418. Operating system 1418, which can be stored on disk storage 1414, acts to control and allocate resources of the computer system 1402. Applications 1420 take advantage of the management of resources by operating system 1418 through program modules 1424, and program data 1426, such as the boot/shutdown transaction table and the like, stored either in system memory 1406 or on disk storage 1414. It is to be appreciated that the claimed subject matter can be implemented with various operating systems or combinations of operating systems.

A user enters commands or information into the computer 1402 through input device(s) 1428. Input devices 1428 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1404 through the system bus 1408 via interface port(s) 1430. Interface port(s) 1430 include, for example, a serial port, a parallel port, a game port, and a universal serial bus (USB). Output device(s) 1436 use some of the same type of ports as input device(s) 1428. Thus, for example, a USB port may be used to provide input to computer 1402 and to output information from computer 1402 to an output device 1436. Output adapter 1434 is provided to illustrate that there are some output devices 1436 like monitors, speakers, and printers, among other output devices 1436, which require special adapters. The output adapters 1434 include, by way of illustration and not limitation, video and sound cards that provide a means of connection between the output device 1436 and the system bus 1408. It should be noted that other devices and/or systems of devices provide both input and output capabilities such as remote computer(s) 1438.

Computer 1402 can operate in a networked environment using logical connections to one or more remote computers, such as remote computer(s) 1438. The remote computer(s) 1438 can be a personal computer, a server, a router, a network PC, a workstation, a microprocessor based appliance, a peer device, a smart phone, a tablet, or other network node, and typically includes many of the elements described relative to computer 1402. For purposes of brevity, only a memory storage device 1440 is illustrated with remote computer(s) 1438. Remote computer(s) 1438 is logically connected to computer 1402 through a network interface 1442 and then connected via communication connection(s) 1444. Network interface 1442 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1444 refers to the hardware/software employed to connect the network interface 1442 to the bus 1408. While communication connection 1444 is shown for illustrative clarity inside computer 1402, it can also be external to computer 1402. The hardware/software necessary for connection to the network interface 1442 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A device having a memory comprising:
   a plurality of bit lines extending in a first direction, wherein the plurality of bit lines comprises a first bit line and a second bit line;
   a plurality of word lines extending in a second direction, wherein the plurality of word lines comprises a first word line and a second word line, wherein the first direction and the second direction are perpendicular or substantially perpendicular;
   a plurality of two-terminal non-volatile memory devices coupled to the plurality of bit lines and the plurality of word lines, wherein the plurality of two-terminal non-volatile memory devices are arranged in an array, wherein each two-terminal non-volatile memory device is coupled to a unique bit line and word line pair, from the plurality of bit lines and the plurality of word lines, wherein the plurality of two-terminal non-volatile memory devices includes a first memory device and a second memory device, wherein the first memory device is coupled to the first bit line and the first word line, and wherein the second memory device is coupled to the second bit line and the second word line;
   a plurality of sense amplifier circuits including a plurality of latches coupled to the plurality of bit lines, wherein each sense amplifier is coupled to a unique bit line, wherein the plurality of sense amplifier circuits are configured to determine presence of read currents upon the plurality of bit lines, wherein the plurality of latches are configured to latch the read currents in response to the presence of read currents, wherein the plurality of sense amplifier circuits includes a first sense amplifier and a second sense amplifier, wherein the first bit line is coupled to the first sense amplifier, and wherein the second bit line is coupled to the second sense amplifier;
   a bit line driver coupled to the plurality of bit lines, wherein the bit line driver is configured to provide a bit line precharge voltage to the plurality of bit lines prior to initiation of a read cycle, wherein the bit line driver is configured to initiate providing a first read voltage higher than the bit line precharge voltage to the first bit line in response to the initiation of the read cycle, and configured to terminate providing the first read voltage to the first bit line in response to the presence of read currents and before termination of the read cycle; and
   a word line driver coupled to the plurality of word lines, wherein the word line driver is configured to provide a word line precharge voltage to the plurality of word lines prior to the initiation of the read cycle, wherein the word line driver is configured to initiate providing a second read voltage lower than the precharge voltage to the first word line in response to the initiation of the read cycle, and configured to terminate providing the second read voltage to the first word line in response to the presence of read currents and before the termination of the read cycle;

wherein the first memory device is configured to provide a first read current in response to the first read voltage and to the second read voltage;

wherein the first latch is configured to latch the first read current before the termination of the read cycle.

2. The device of claim 1, wherein the first sense amplifier is configured to provide the first read current after the termination of the read cycle.

3. The device of claim 1, wherein the first memory cell comprises:

a selector device; and a two-terminal memory device coupled in series with the selector device.

4. The device of claim 3, wherein the two-terminal memory device is selected from a group consisting of: a reversible conductive filamentary random access memory device, a phase change memory device (PC-RAM), a magneto-resistive memory device (MRAM), and a conductive bridging memory device (CB-RAM).

5. The device of claim 3, wherein the two-terminal memory device comprises a non-volatile resistive switching material layer comprising a plurality of defects, wherein the resistive switching material layer comprises a material selected from a group consisting of: non-stoichiometric silicon oxide, a non-stoichiometric metal oxide, non-stoichiometric aluminum oxide, and a non-stoichiometric tantalum oxide.

6. The device of claim 5, wherein the two-terminal memory device further comprises:

an active metal-containing layer coupled to the resistive switching material layer, wherein the active metal-containing layer is configured to provide metal ions to defect location within the resistive switching material layer, wherein the metal ions are selected from a second group consisting essentially of: copper, aluminum, chromium, and hafnium; and wherein the plurality of defects trap the metal ions therein.

7. The device of claim 3, wherein the selector device comprises a volatile resistive switching material layer comprising a material selected from a group consisting of: a non-stoichiometric compound, a non-stoichiometric metal oxide, and a non-stoichiometric metal nitride.

8. The device of claim 7, wherein the selector device comprises a pair of metal-containing electrodes disposed upon opposite sides of the volatile resistive switching material layer, wherein a metal ion of the pair of metal-containing electrodes is selected from a second group consisting essentially of: copper, aluminum, chromium, and hafnium.

9. The device of claim 1, wherein:

the bit line driver is configured to maintain the precharge voltage on the second bit line during the read cycle; and the word line driver is configured to maintain the precharge voltage on the second word line during the read cycle.

* * * * *